(12) United States Patent
Gata et al.

(10) Patent No.: US 6,433,722 B1
(45) Date of Patent: Aug. 13, 2002

(54) DIFFERENTIAL CURRENT MULTIPLEXER FOR CURRENT SWITCHED DACS

(75) Inventors: Daramana G. Gata; Donald C. Richardson, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/923,706

(22) Filed: Aug. 7, 2001

Related U.S. Application Data

(60) Provisional application No. 60/224,063, filed on Aug. 9, 2000.

(51) Int. Cl.$^7$ ................................................. H03M 1/66
(52) U.S. Cl. ....................................... 341/144; 341/141
(58) Field of Search ............................... 341/144, 141; 327/108, 103

(56) References Cited

U.S. PATENT DOCUMENTS

| | | | | |
|---|---|---|---|---|
| 5,841,383 A | * | 11/1998 | Regier | ......................... 341/122 |
| 5,856,891 A | * | 1/1999 | Ngo | ............................. 360/66 |
| 6,340,939 B1 | * | 1/2002 | Dedic | .......................... 341/136 |

* cited by examiner

Primary Examiner—Peguy Jeanpierre
(74) Attorney, Agent, or Firm—J. Dennis Moore; W. James Brady, III; Frederick J. Telecky, Jr.

(57) ABSTRACT

A circuit and method is provided that allows for communication of digital to analog data over more that one channel employing a single current switching DAC and a current switching multiplexer. The current switching multiplexer is an output stage circuit that is used to steer the current from one output channel to another. The data rate of the data transmitted to the DAC is increased by the number of channels that the data is being transmitted over. The data is then switched from one channel to the other by employing a current switching multiplexer, such that the device provides for the same functionality that conventional devices utilizing a single DAC for multiple channels as opposed to a single DAC for a single channel.

30 Claims, 9 Drawing Sheets

DIFFERENTIAL CURRENT MULTIPLEXER FOR CURRENT SWITCHED DACS

This application claims priority under 35 USC §119(e)(1) of provisional application Ser. No. 60/224,063, filed Aug. 9, 2000.

TECHNICAL FIELD

The present invention relates to electrical circuits, and more particularly to a circuit and method for transmitting digital-to-analog data over more than one channel employing a single DAC.

BACKGROUND OF THE INVENTION

Current switching digital-to-analog converters (DACs) are utilized in a variety of applications such as instrumentation applications, level detection applications, drivers for LCD screens, servo tracking and communication applications. In a current switching digital-to-analog converter, inputed binary code turns on a selection of current sources wired to generate appropriately scaled currents. The output currents are summed and are either brought out directly as a current output or converted internally to a voltage via an op-amp summing junction circuit or the like. Recently DACs have been employed in greater numbers in communication devices to provide digital capabilities to devices, while providing analog signaling to communication lines. Typically in these implementations where multiple channels are involved, a single DAC is dedicated to each channel. These DACs take up substantial space when implemented on an integrated circuit device.

One communication technology that has evolved that employs DACs for providing digital-to-analog conversions over communication channels is known as the Asymmetric Digital Subscriber Line (ADSL). ADSL is a new modem technology that converts existing telephone lines into access paths for multimedia and high speed data communications. ADSL utilizes advanced digital signal processing and creative algorithms to squeeze greater amounts of information through twisted-pair telephone lines than was conventionally feasible. The ADSL standard calls for a specifically designed modem at each end of a twisted pair copper line, one at a home and the other at a central office of the phone company. Although the conventional telephone voice circuit has only a 4 khz bandwidth, the physical wire connection bandwidth is more than 1 MHz.

ADSL exploits the extra bandwidth to send data to the central office where it can connect to a phone company's high capacity fiber optic network. ADSL modems increase the amount of information that conventional phone lines can carry buy using discrete multi-tone technology (DMT). DMT divides the bandwidth into independent sub-bands, then transmits data on all of the subbands simultaneously. Echo cancellation techniques allow upstream and downstream data to overlap. The standard also reserves a four KHz region at the DC end of the frequency band for POTS (i.e., Plain Old Phone System). ADSL is particularly attractive for consumer Internet applications where most of the data traffic is downloaded to the customer. Upstream bandwidth for uploading data can be reduced to increase downstream bandwidth since most Internet traffic is downstream.

Terminals employed at the central office typically communicate over several channels. These terminals employ modems or other communication devices for data transmissions. These modems or other communication devices can employ a digital processor, a coder/decoder component, line drivers and other peripheral devices to support transmitting and receiving of analog signal transmissions. The coder/decoder components include DACs and other devices to convert digital data to analog data for transmission over communication channels. These coder/decoder components can be in the form of integrated circuits, such that the DACs and other devices are integrated into a single chip. A DAC is required for each transmit channel that is provided by the coder/decoder component. The DAC consumes power and takes up more real estate on the integrated circuit than other components.

In view of the above, it is apparent that there is an unmet need for improvements in the utilization of DACs for various applications including communication systems.

SUMMARY OF THE INVENTION

According to one aspect of the present invention, a circuit and method is provided that allows for communication of digital-to-analog data over more than one channel employing a single current switching DAC and a current switching multiplexer. The current switching multiplexer is an output stage circuit that is used to steer the current from one output channel to another. The data rate of the data transmitted to the DAC is increased by the number of channels over which the data is transmitted. The data is then switched from one channel to the other by employing a current switching multiplexer, such that the device provides the same functionality of conventional devices which utilize a single DAC for each channel.

The current switching multiplexer includes a first and second differential current switch embedded in a differential inverter circuit. The differential inverter circuit includes a plurality of n-transistors and p-transistors that are sized to provide matching transconductances for smooth transition switching.

In one aspect of the invention, the current level of at least one unselected channel can be set to provide increased switching speed and better overall performance to current to voltage converters coupled to the unselected output channel. Typically, the current is set to a midpoint current very close to a transition point, such that settling time of a current to voltage converter (e.g., a low pass filter) is reduced. Controlling the midpoint current of the unselected output provides fast switching of data between channels and reduced harmonic distortion, thereby boosting performance of the data transmission circuit.

Thus, according to another aspect of the present invention, a multiple channel data transmission circuit is provided. The multiple channel transmission circuit comprises a current switching digital-to-analog converter operable to receive digital data and generate a pair of differential analog current signals corresponding to the digital data. A current switching multiplexer is coupled to the current switching digital-to-analog converter. The current switching multiplexer is operable to switch the pair of differential analog current signals between at least two channels. A current-to-voltage converter component is provided for each of the at least two channels. The current-to-voltage converter component is operable to convert the pair of differential analog current signals to a pair of differential analog voltage signals.

In accordance with another aspect of the present invention, an ADSL communication circuit is provided for transmitting data across multiple channels. The ADSL communication circuit comprises a current switching digital-to-analog converter operable to receive frames of digital data to be transmitted across a first and a second channel. The current switching digital-to-analog converter is adapted to generate sequences of differential analog current signals corresponding to the frames of digital data. A current switching multiplexer is coupled to the current switching digital-to-analog converter. The current switching multiplexer is operable to switch the sequences of differential analog current signals between a first and a second output based on a selection and a non-selection of a first and a second selection control line. A first current to voltage converter circuit is coupled to the first output of the current switching multiplexer and a second current to voltage converter is coupled to the second output of the current switching multiplexer. This current to voltage converter can be a current input low pass filter. In the detailed description, a low pass filter circuit will be utilized to indicate an exemplary current to voltage converter. The first low pass filter is adapted to convert sequences of analog current signals to sequences of analog voltage signals for transmission over the first channel and the second low pass filter is adapted to convert sequences of analog current signals to sequences of analog voltage signals for transmission over the second channel.

Yet another aspect of the invention relates to method for transmitting data over multiple communication lines. The method comprises the steps of providing frames of digital data assigned to more than one channel to a current switching digital-to-analog converter and converting the frames of digital data to sequences of analog current data by the current switching digital-to-analog converter. The sequences of analog current data are then switched between multiple channels based on a channel that the data is assigned. The analog current data is then converted to analog voltage data prior to transmission over a communication line.

In accordance with yet another aspect of the invention, an ADSL communication circuit is provided for transmitting data across multiple channels. The communication ADSL circuit comprises means for converting frames of digital data to be transmitted over at least two channels to sequences of analog current data, means for switching the sequences of analog current data between the at least two channels and means for selecting the channel of the at least two channels for transmitting the sequences of analog current data. The communication ADSL circuit also comprises means for converting the analog current data to analog voltage data prior to transmission of the data over a communication line.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The present invention will be described with reference to a circuit and a method of providing digital-to-analog data over more than one communication channel employing a single digital-to-analog converter (DAC). It should be understood that the description below is merely illustrative and that they should not be construed in a limiting sense.

Figure 1:
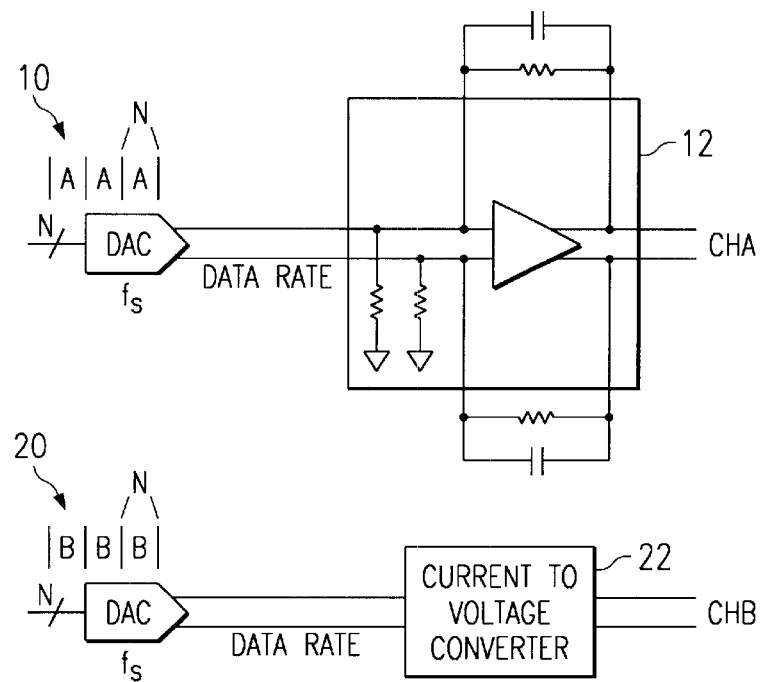
FIG. 1 illustrates a block schematic diagram of a device for transmitting digital-to-analog converted data over multiple channels in accordance with the prior art.

FIG. 1 illustrates a prior art implementation employing current switching DACs for converting digital signals to analog signals over multiple channels. A first current switching DAC 10 is provided to convert digital data to analog data for communicating the analog data over a first channel CHA. The first current switching DAC 10 receives frames of digital data "A" of N bytes at a data rate of $f_s$. The first current switching DAC 10 converts the data to a differential analog current signal which is converted to a differential voltage signal by a current to voltage converter 12. The current to voltage converter 12 of CHA is a low pass filter, which is what is typically used in an ADSL implementation or the like. However, other current-to-voltage converters may be used for other technological implementations. A second current switching DAC 20 is provided to convert digital data to analog data for communicating the analog data over a second channel CHB. The first current switching DAC 20 receives frames of digital data "B" of N bytes at a data rate of $f_s$. The second current switching DAC 20 converts the digital data to a differential analog current signal which is converted to a differential voltage signal by a current to voltage converter 22. As can be seen in prior art FIG. 1, multiple DACs 10, 20 are required to support data transmission over multiple channels.

The present invention employs a differential current multiplexer at an output stage of a DAC so that a single DAC can be utilized to transmit data over multiple channels (hereinafter referred to as a single-to-multiple channel DAC component). For example, this can be accomplished for two channels by transmitting data to the DAC at twice the frequency of the conventional device in FIG. 1. The data is then switched by the differential current multiplexer between the two channels to a respective current-to-voltage converter for that respective channel.

Figure 2:
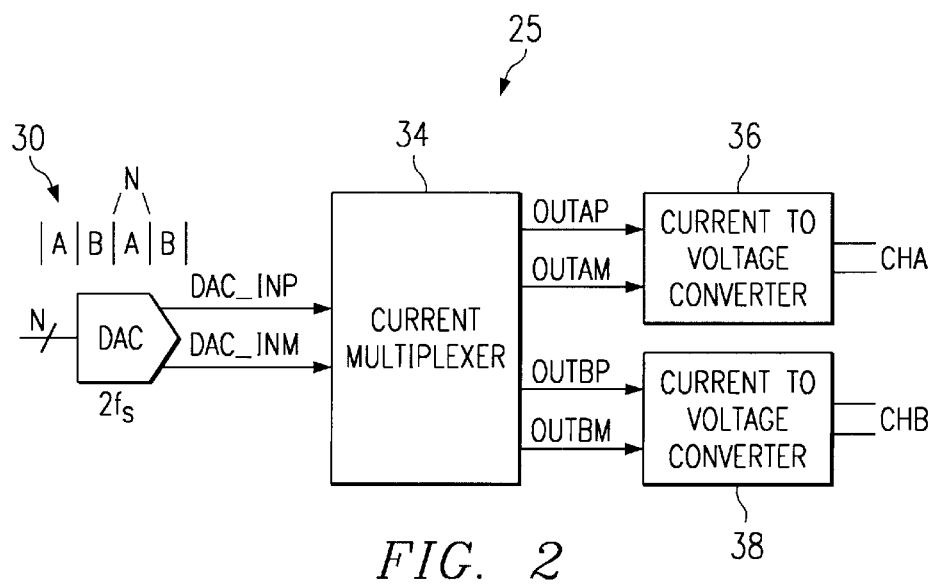
FIG. 2 illustrates a block schematic diagram of a device for transmitting digital-to-analog converted data over multiple channels in accordance with one aspect of the present invention.

Referring now to FIG. 2, a single-to-multiple channel DAC component 25 is provided having a single current switching DAC 30 that converts digital data to an analog differential current signal for two channels by employing a differential current multiplexer 34 at an output stage of the DAC 30. Although two channels are illustrated for simplicity purposed, it is to be appreciated that additional channels may be employed by increasing the data rate to the DAC 30. The single current switching DAC 30 receives frames of digital data "A" and "B" of N bytes for each respective channel at a data rate of $2*f_s$. The single current switching DAC 30 converts the frames of data to a sequence of differential analog current signals (DAC_INP and DAC_INM), which are transmitted to a differential current multiplexer 34. The differential current multiplexer 34 switches the sequences of analog current signals between a first channel A and a second channel B. The first channel A is coupled to a first current-to-voltage converter 36 and the second channel B is coupled to a second current-to-voltage converter 38. The first current-to-voltage converter 36 and the second currentto-voltage converter 38 convert the sequences of differential analog current signals to sequences of differential voltage signals for transmission over channels A and B, respectively.

Figure 3A:
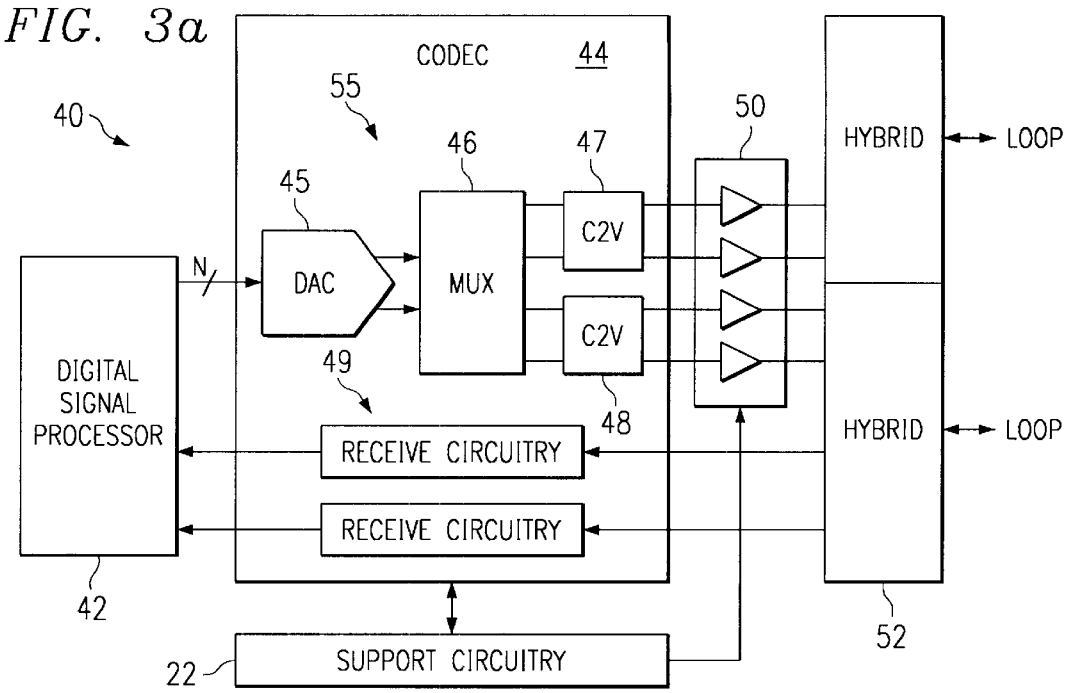
FIG. 3a illustrates a block schematic diagram of a terminal in a central office environment in accordance with one aspect of the present invention.

FIG. 3a illustrates an example of an environment employing the present invention. A terminal 40, such as one located at a central office, is provided with a digital signal processor 42 that is coupled to a coder/decoder (CODEC) component 44. The digital signal processor 42 provides and receives data from the CODEC component 44 employing ADSL standard algorithms. The CODEC component 44 includes a single-to-multiple channel DAC component 55 having a DAC 45 that receives frames of N data bytes from the digital signal processor 42 and converts that data to sequences of differential analog current signals. The differential analog current signals are then transmitted to a differential current multiplexer component 46, which switches the differential analog current signals between a first current-to-voltage converter 47 over a first channel and a second current to voltage converter 48 over a second channel. The first current to voltage converter 47 and the second voltage converter 48 are coupled to a line driver 50. The line driver 50 interfaces with a 2-to-4 wire hybrid 52, which is coupled to a loop transmission line. Analog receive data is transmitted from the loop transmission line from the 2–4 wire hybrid 52, which is coupled to a receive circuitry component 49 of the CODEC 44. The receive circuitry component 49 converts the analog data to digital data for processing by the digital signal processor. A support circuitry component 22 provides power, clock and compensation components to the terminal 40.

Figure 3B:
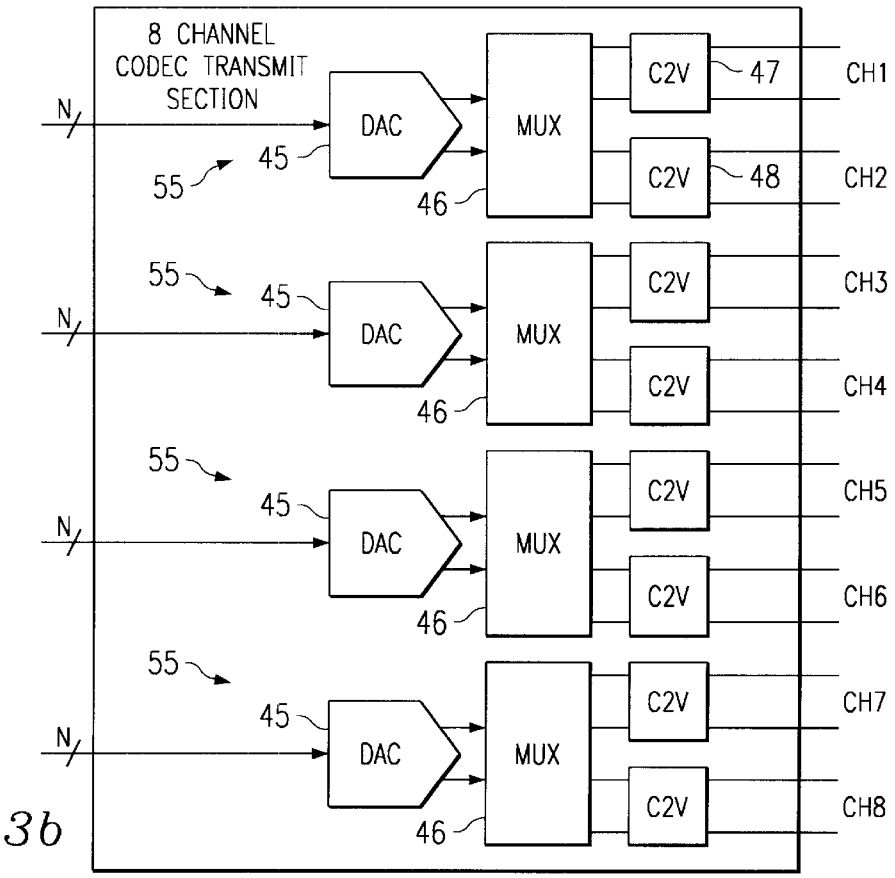
FIG. 3b illustrates a block schematic diagram of an eight channel coder/decoder module in accordance with one aspect of the present invention.

The single-to-multiple channel DAC component 55 may also be employed in other CODEC devices employing an additional number of channels as the CODEC 44 illustrated in FIG. 3a. FIG. 3b illustrates an eight channel CODEC 56 on an integrated circuit. The eight channel CODEC 56 employs four single-to-multiple channel DAC components 55. The four single-to-multiple channel DAC components 55 provide eight channels utilizing four current switching DACs 45, four differential current multiplexers 46 and eight current-to-voltage converters 47 and 48. Due to the fact that the DACs 45 are relatively large components, a reduction from eight to four DACs, in accordance with the present invention, reduces the area on the die of the integrated circuit 56. This also allows for a reduction in the size and the overall power consumption of the integrated circuit 56.

Figure 4:
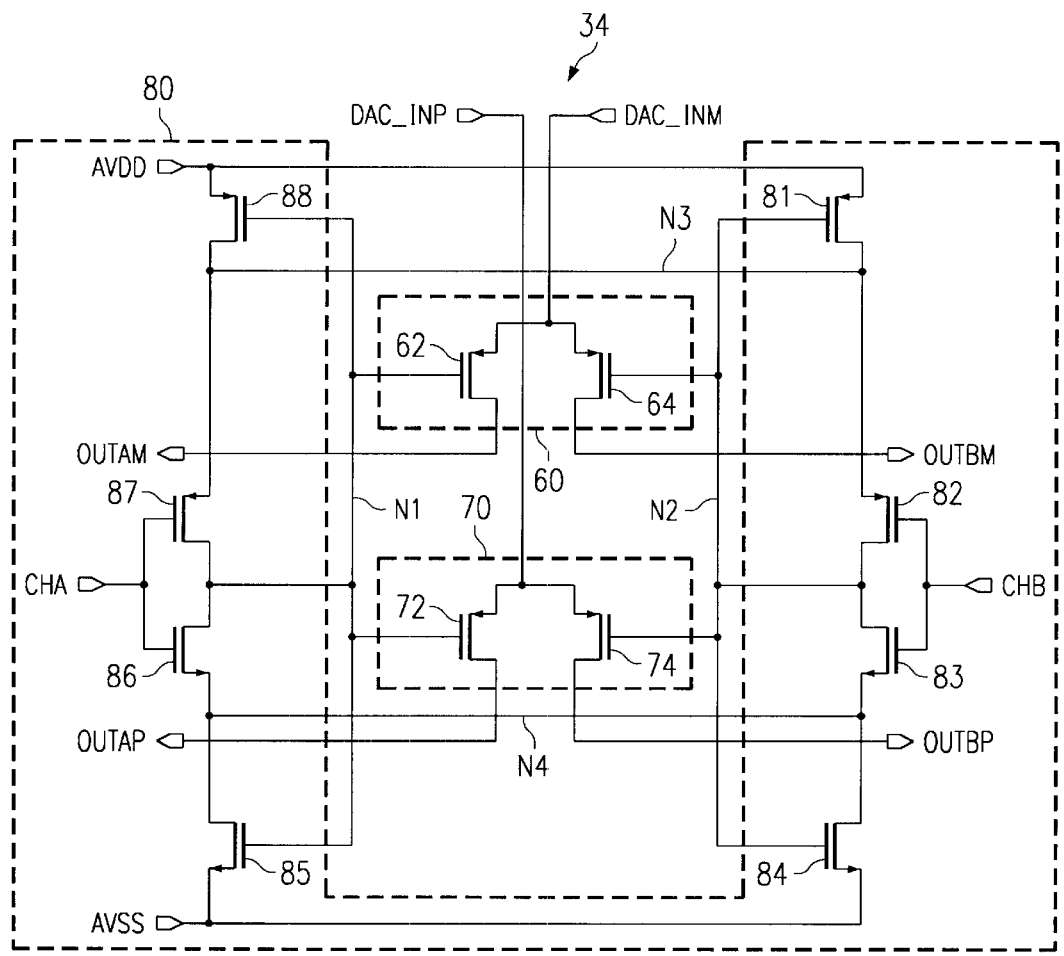
FIG. 4 illustrates a schematic circuit diagram of the current switching multiplexer in accordance with one aspect of the present invention.

FIG. 4 illustrates a schematic view of components forming the differential current multiplexer 34. The differential current multiplexer 34 includes a first differential current switch 60 comprised of transistors 62 and 64 and a second differential current switch 70 comprised of transistor 72 and 74. The first differential current switch 60 and the second differential current switch are embedded inside a differential inverter circuit 80 comprised of transistors 81, 82, 83, 84, 85, 86, 87 and 88. A differential current signal is input at DAC_INP and DAC_INM and switched between OUTAP and OUTAM and OUTBP and OUTBM, respectively. The state of the CHA and CHB control inputs determine to which output channel the input currents DAC_INP and DAC_INM will be steered. Selection of CHA or CHB provide a differential input voltage at nodes N1 and N2, steering the current to one channel or the other. CHA and CHB select control inputs will be in opposite states; therefore, if CHA is high and CHB is low then the current flows out to OUTAP and OUTAM and then as CHA goes low and CHB goes high then the current is steered to OUTBM and OUTBP.

Referring in more detail to the operation of the components forming the current switching multiplexer 34 of FIG. 4, if CHA is high and channel CHB is low, node N1 will be pulled low. This will result in transistors 88 and 86 being on, transistors 87 and 85 being off and node N3 being high and node N4 being low. Transistors 62 and 72 will therefore turn on and transistors 64 and 74 will be off, steering current from DAC_INP and DAC_INM to OUTAP and OUTAM, respectively. Conversely, if CHB is high and channel CHA is low, node N2 will be pulled low. This will result in transistors 85 and 87 being on, transistors 86 and 88 being off and node N3 being high and node N4 being low. Transistor 64 and 74 will therefore turn on and transistor 62 and 72 will be off, steering current from DAC_INP and DAC_INM to OUTAP and OUTAM, respectively.

The differential current multiplexer 34 can be located at an output stage of a DAC so that a single DAC can be utilized to transmit data over multiple channels. This can be accomplished for two channels by transmitting data to the DAC at twice the frequency of conventional devices. The data is then switched by the differential current multiplexer between the two channels to a respective current-to-voltage converter for that respective channel.

Figure 5:
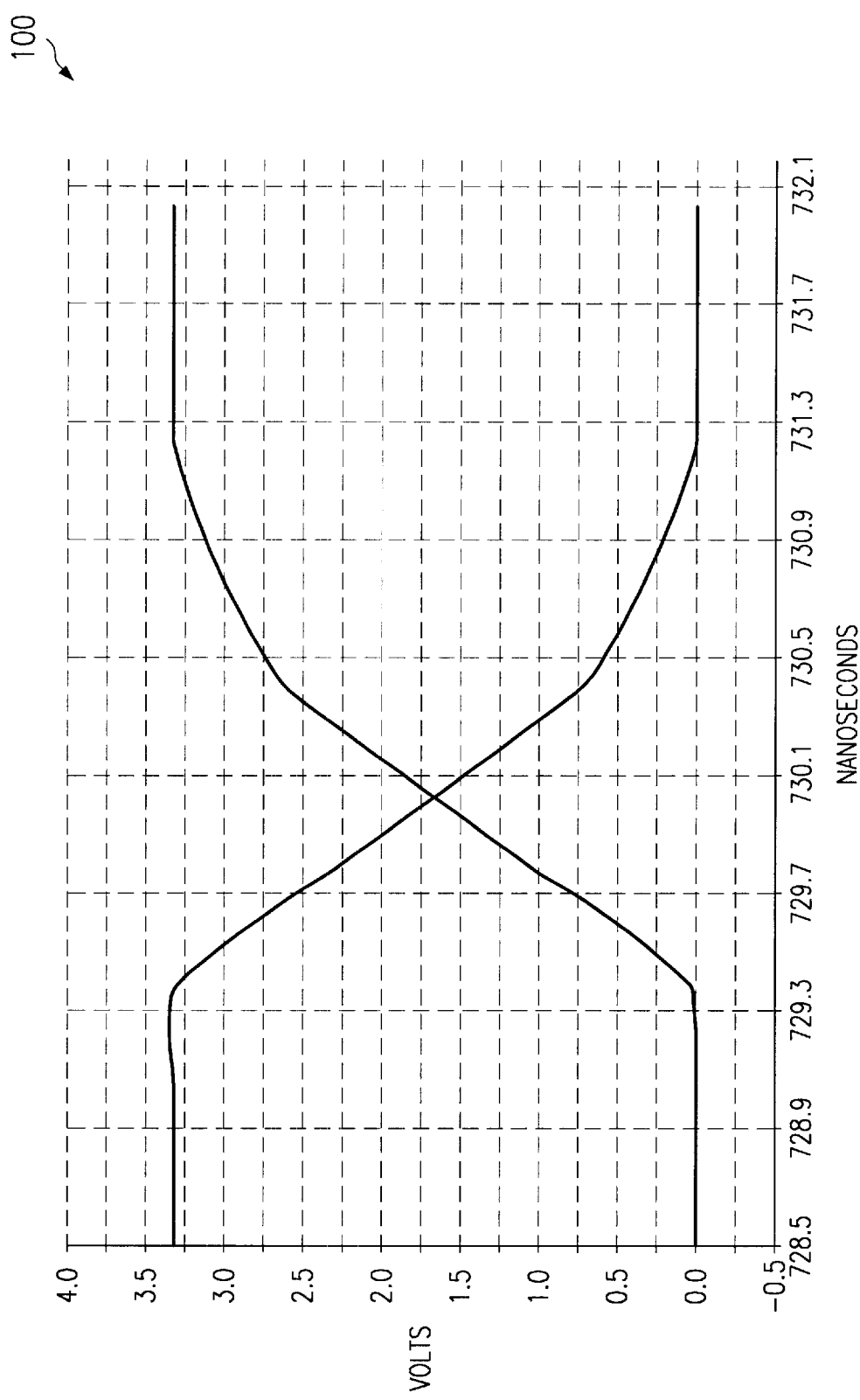
FIG. 5 illustrates a graph of the switching speed of a differential inverter circuit associated with the current switching multiplexer of FIG. 4 in accordance with one aspect of the present invention.

According to one aspect of the present invention, the exact switching instant may be controlled by the relative sizing of the differential inverter transistors that drive the gate to source capacitance Cgs of the current switching p-channel transistors and the current switching n-channel transistors. For example, the p-channel resistors 81, 82, 87 and 88 of the differential inverter circuit 80 may have a width to length ratio (W/L) of 32/0.8 where width is the depth of the transistor and length is the channel length thereof. The n-channel resistors 83, 84, 85 and 86 of the differential inverter circuit 80 may have a width to length (W/L) ratio of 12.4/0.8. The sizing of the differential inverter transistors ensure that the transconductances of the N and the P transistors are approximately equivalent. This provides a smooth, but fast switching action of the differential inverter circuit as illustrated in graph 100 of FIG. 5.

Figure 6:
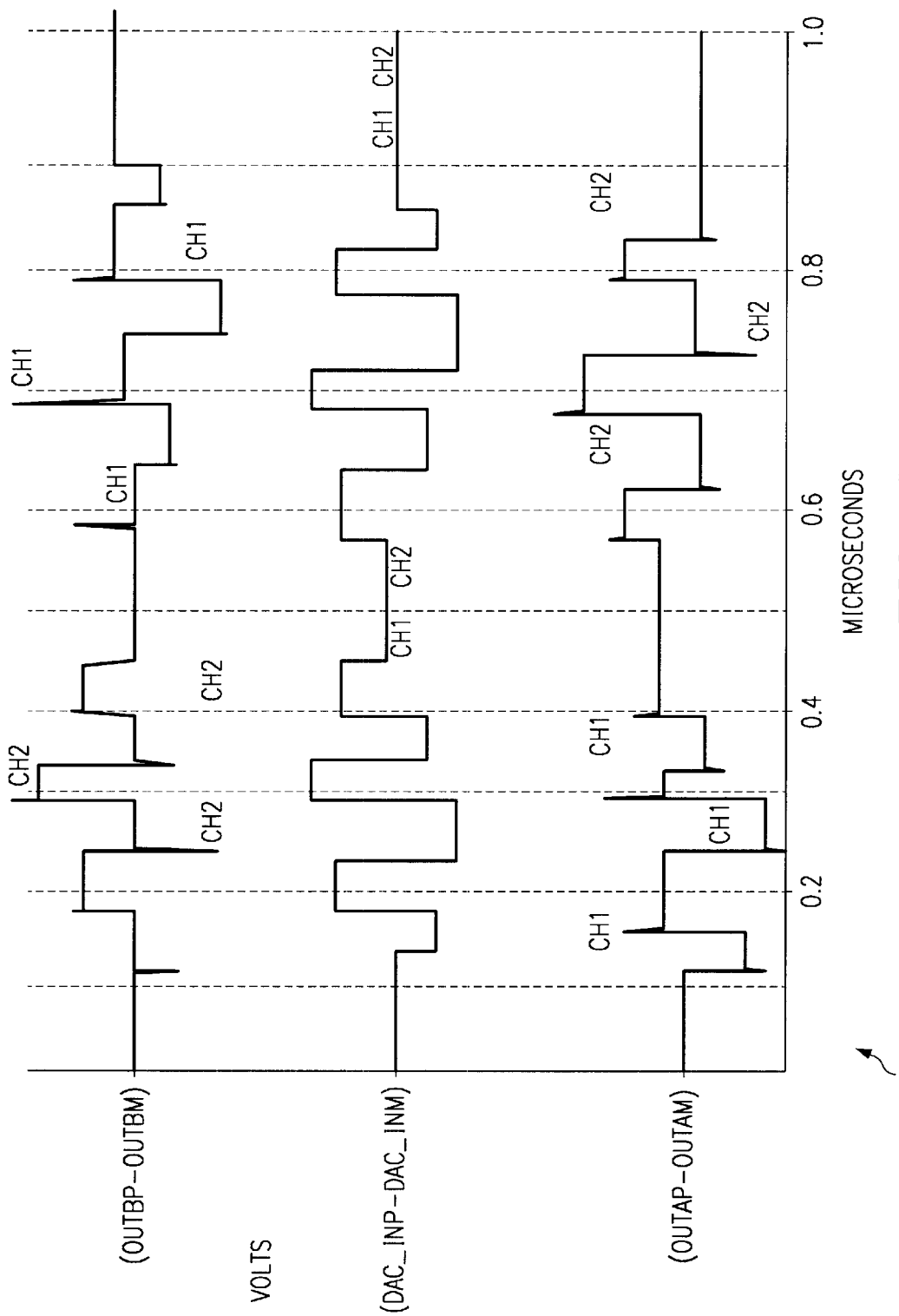
FIG. 6 illustrates a graph of exemplary composite differential input currents and composite differential output currents in accordance with one aspect of the present invention.
Figure 7:
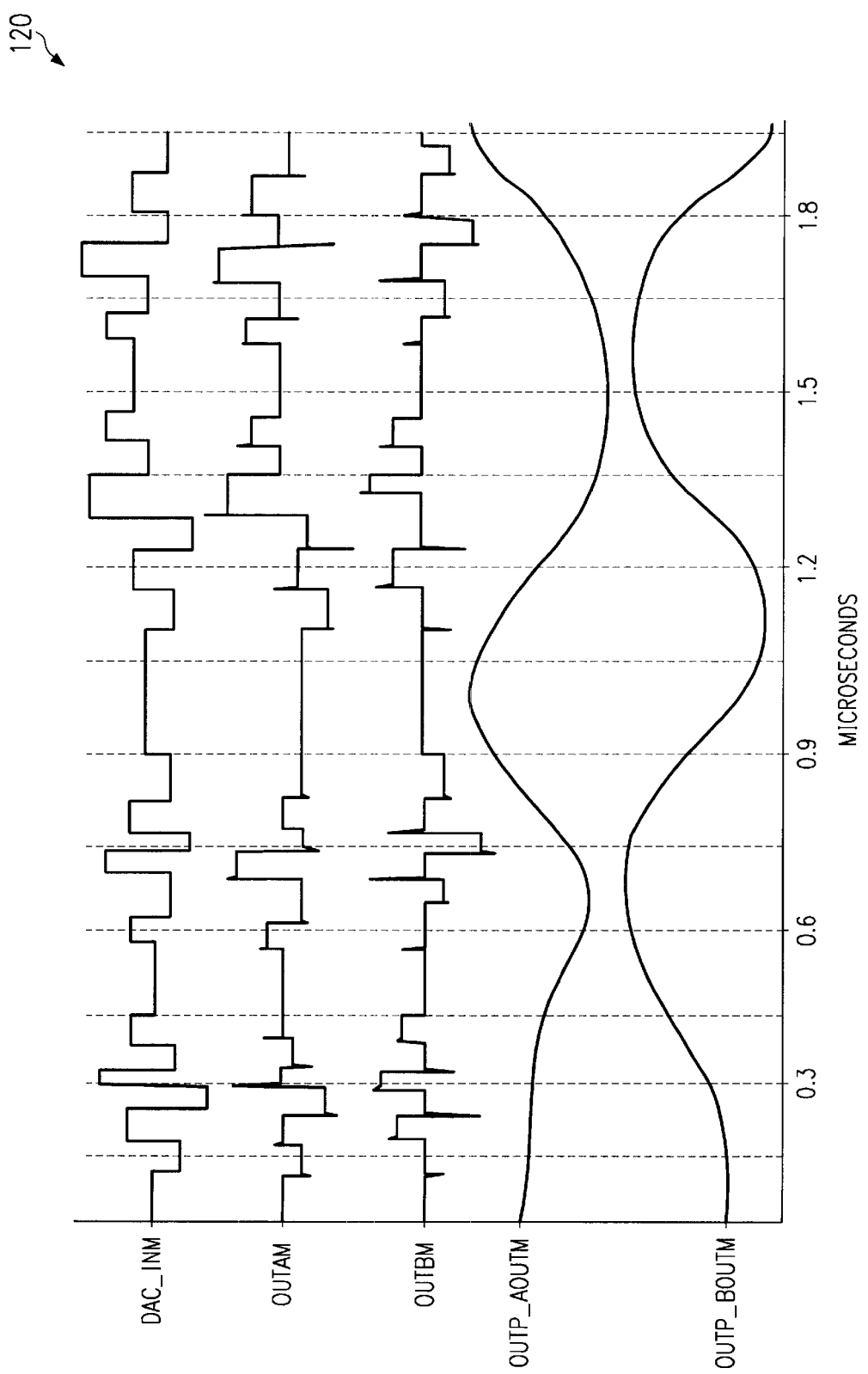
FIG. 7 illustrates a graph of the currents of FIG. 6 including output signals that are a result of being fed through a low pass filter in accordance with one aspect of the present invention.

FIG. 6 shows an example of composite differential input currents and output currents of the current switching multiplexer 34 in a graph 110. The middle signal is DAC_INP minus DAC_INM which illustrates an example of a composite signal of two differential inputs offset by 56 ns. The bottom signal is OUTAP minus OUTAM illustrating an example of a composite signal of the differential input steered to the output selected by CHA represented as a negative going sine wave, while the top signal OUTPBP minus OUTPBM illustrates a composite signal of the differential input steered to the output selected by CHB represented as a positive going sine wave. FIG. 7 illustrates a graph 120 including the signals of FIG. 6 and additional signals obtained if the composite signals are fed to a low pass filter. The respective signal waves OUTP_AOUT and OUTP_BOUT are offset from one another by 56 ns because of the built-in delay of the switching speed. For two independent channels in, for example, an ADSL system, the multiplexer circuit illustrated in FIG. 4 could save the overall area and power on an integrated circuit component based on the DAC implementation, for example, illustrated in FIGS. 3a and 3b.

An additional consideration of a DAC data transmission circuit is the DC input current level to a current-to-voltage converter of an unselected channel. For example, if the input current level to the current-to-voltage converter of the unselected channel is left at a zero input current level, it will take much longer for the current-to-voltage converter to settle and switch from a non-transmitting state to a transmitting state. During multiplexing of the current between the two channels, the non-selected channels will operate closer to optimization if the current is held at some DC midpoint. This is due to the fact that a non-selected operational amplifier associated with the current-to-voltage converter has to settle after being selected and if it is allowed to float when it is not selected it will tend to go to zero. This takes a longer time to settle once that particular circuit is selected as opposed to when the operational amplifier is held at a midpoint current level. Additionally, by holding the non-selected channel close to its midpoint value, it will take a shorter amount of time to switch states when the channel becomes selected. Furthermore, when the midpoint value is considered a zero signal, harmonic distortion is reduced by the symmetry of transitions between the idle state midpoint value and active state values above and below the midpoint value.

Figure 8:
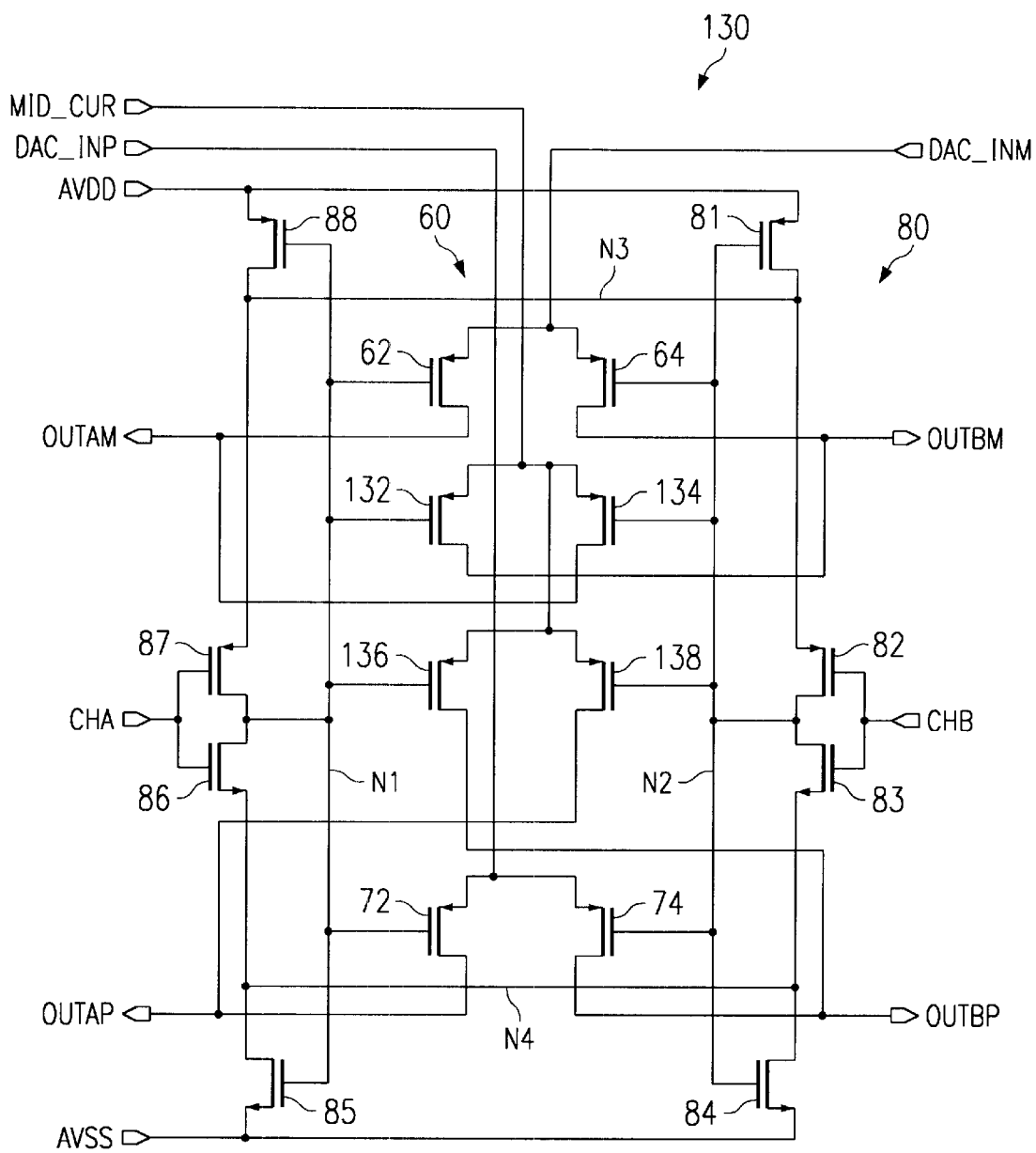
FIG. 8 illustrates a schematic circuit diagram of the current switching multiplexer of FIG. 4 including additional differential current switches to provide a midcurrent signal in accordance with one aspect of the present invention.

FIG. 8 illustrates an alternate aspect of the invention including a differential current multiplexer where the voltage level of the non-selected channel can be controlled. A current switching multiplexer 130 is provided that includes transistors 132, 134, 136 and 138 added to the current multiplexer 34 of FIG. 4. The transistors 132, 134, 136 and 138 are connected such that when one of the channels is not selected it will receive the current set by a MID_CUR input as a differential value (e.g., MID_CUR/2).

Referring in more detail to the operation of the components forming the current switching multiplexer 130 of FIG. 8, if CHA is high and channel CHB is low, node N1 will be pulled low and node N2 will be high. Transistors 64 and 74 will be off and transistors 62 and 72 will be on, steering current from DAC_INP and DAC_INM to OUTAP and OUTAM, respectively. Thus under such conditions CHA is the selected channel and CHB is the unselected channel. Transistors 132 and 136 will be on because N1 is low and transistors 134 and 138 will be off steering the current provided at MID_CUR to both OUTBM and OUTBP. If transistor 134 and 138 are the similarly sized, the MID_CUR value will split generally equally between OUTAM and OUTAP. Alternatively, two separate MID_CUR inputs could be used; one for transistors 132 and 134, and another for transistors 136 and 138.

If CHB is high and channel CHA is low, node N2 will be pulled low and node N1 will be high. Transistors 62 and 72 will be off and transistors 64 and 74 will be on, steering current from DAC_INP and DAC_INM to OUTBP and OUTBM, respectively. Thus under such conditions CHB is the selected channel and CHA is the unselected channel. Transistors 134 and 138 will be on and transistors 132 and 136 will be off steering the current provided at MID_CUR to both OUTAM and OUTAP. If transistors 132 and 136 are the similarly sized, the MID_CUR value will split generally equally between OUTAM and OUTAP. Alternatively, separate MID_CUR sources could be used as previously discussed above. Therefore, it can be seen that when CHB is selected channel, the unselected channel (CHA) may be held close to its midpoint using the MID_CUR feature.

Figure 9:
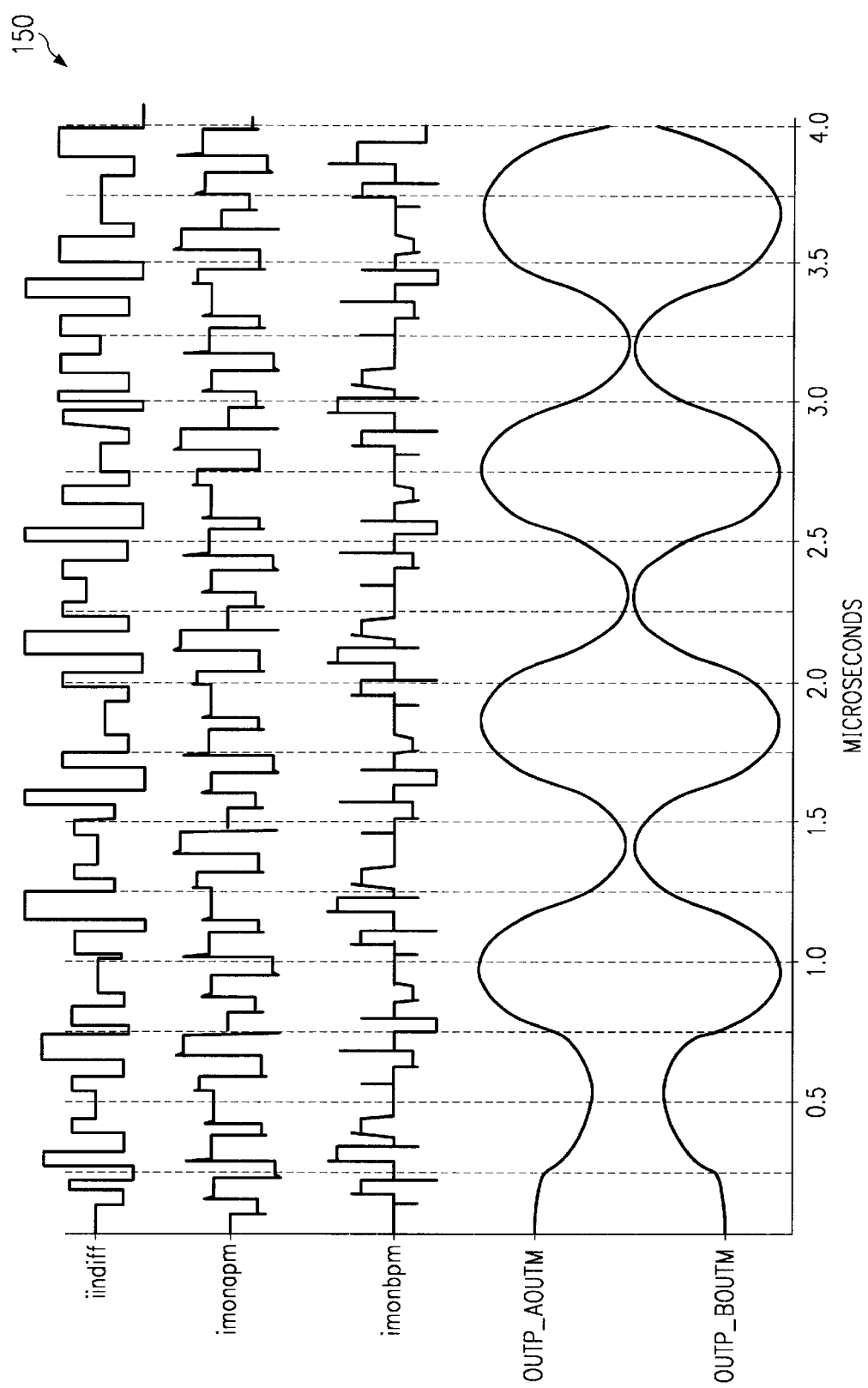
FIG. 9 illustrates a timing diagram of data transmission at different locations of a data transmission device employing the current multiplexer of FIG. 8 in accordance with the present invention.

FIG. 9 illustrates a graph 150 of the differential currents of the multiplexer of FIG. 8 where the off current of a nonselected channel is selected to maintain an input current to a current-to-voltage converter near a midpoint value. OUTP_AOUTM and OUTP_BOUTM illustrate the smooth output transitions of the current-to-voltage converter.

Figure 10A:
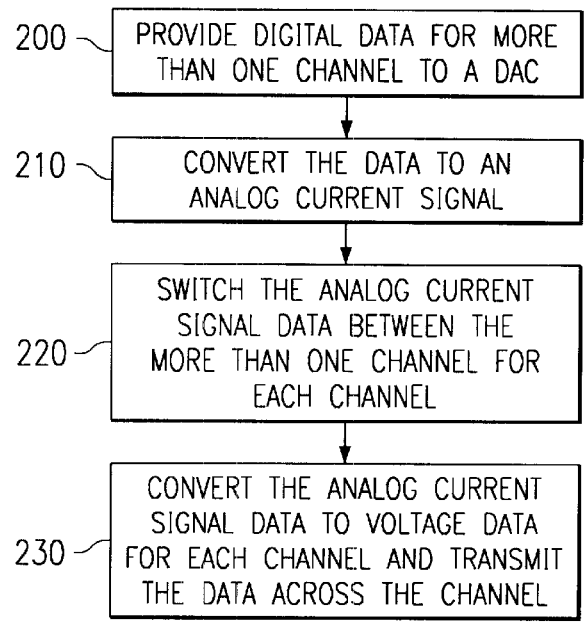
FIG. 10a illustrates a flow chart of one particular methodology for transmitting data in accordance with one aspect of the present invention.
Figure 10B:
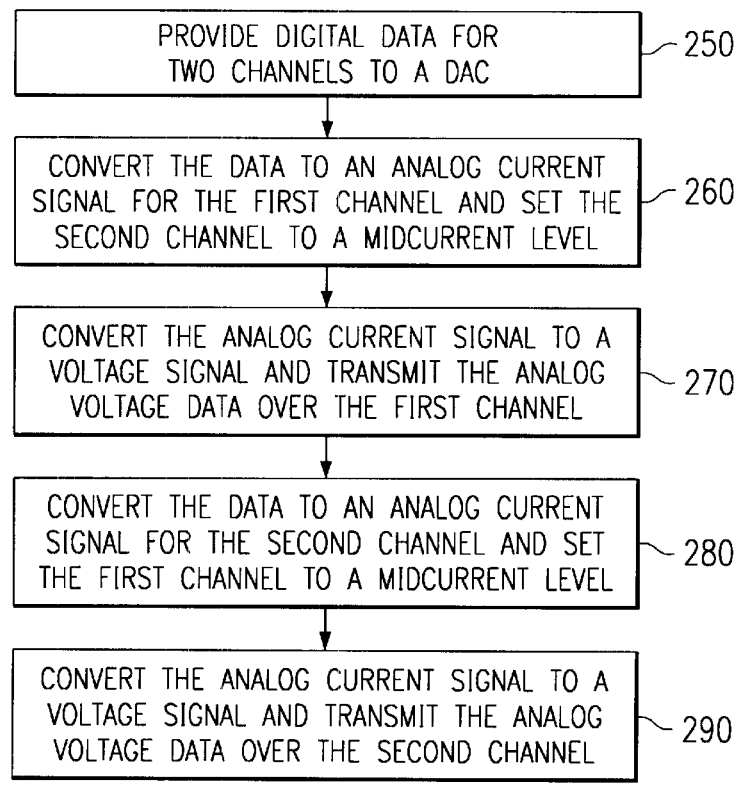
FIG. 10b illustrates a flow chart of another particular methodology of transmitting data in accordance with one aspect of the present invention.

FIGS. 10a and 10b are flow diagrams representing a data transmission methodology in accordance with another aspect of the present invention. While, for purposes of simplicity of explanation, the methodology of FIGS. 10a and 10b are shown and described as a series of steps, it is to be understood and appreciated that the present invention is not limited to the order of steps, as some steps may, in accordance with the present invention, occur in different orders and/or concurrently with other steps from that shown and described herein. For example, a methodology in accordance with an aspect of the present invention may be represented as a combination of various states (e.g., in a state diagram). Moreover, not all illustrated steps may be required to implement a methodology in accordance with an aspect the present invention.

FIG. 10a is a flow diagram illustrating one particular methodology for transmitting data over more than one channel employing a single DAC according to the present invention. At step 200, frames of digital data for more than one channel is provided to a DAC. The digital data is then converted to sequences of analog current signals at step 210. At step 220, the sequences of analog current signals are switched between channels based on which channel the sequence is assigned and a selection of that channel via a selection control input. The analog current signal sequence are then converted to voltage data for the respective channels and transmitted out the respective channel to a remote location at step 230.

FIG. 10b is a flow diagram illustrating one particular methodology for transmitting data over two channels employing a single DAC according to the present invention. At step 250, frames of digital data for two channels is provided to a DAC. The digital data associated with a first channel is then converted to an analog current signal. The analog current signal associated with the first channel is switched through the first channel, while the second channel (the unselected channel) is held at a midcurrent level at step 260. At step 270, the analog current signal data for the first channel is converted to voltage signal data, which is then transmitted to a remote location over the first channel. The digital data is then converted to an analog current signal for the second channel, while the first channel (the unselected channel) is held at a midcurrent level at step 280. At step 290, the analog current signal data for the second channel is converted to voltage signal data, which is then transmitted to a remote location over the second channel. Holding the non-selected channel close to its midpoint value provides for a quicker and smoother transition between channels and between the idle states and active states of each channel.

It is to be appreciated that although the present invention has been described with respect to an example of a communication circuit and method, the present circuit and method may be employed in other technological implementations employing DACs and data transmission over multiple channels, such as instrumentation equipment, level detection, LCD drivers and servo tracking. In addition, although the present invention has been described in conjunction with a differential example, the present invention also may be employed within a single-ended circuit solution, and such implementations are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A multiple channel data transmission circuit, comprising:
    a current switching digital-to-analog converter operable to receive digital data and generate a pair of differential analog current signals corresponding to the digital data; and
    a current switching multiplexer coupled to the current switching digital-to-analog converter, wherein the current switching multiplexer is operable to switch the pair of differential analog current signals between at least two channels.

2. The circuit of claim 1, wherein the at least two channels is two channels and the differential analog current signals are switched between the two channels based on which channel is selected and which channel is not selected.

3. The circuit of claim 2, wherein a first current-to-voltage component is coupled to a first output of the current switching multiplexer and a second current-to-voltage component is coupled to a second output of the current switching multiplexer.

4. The circuit of claim 3, wherein the current switching multiplexer provides for selectability of the current level of the non-selected channel.

5. The circuit of claim 4, the first and second current-to-voltage components comprising low pass filters.

6. The circuit of claim 1, the current switching multiplexer comprising a first differential current switch and a second differential current switch embedded in a differential inverter circuit.

7. The circuit of claim 6, wherein differential inverter circuit comprises a plurality of p-transistors and n-transistors that are sized to have generally matching transconductances.

8. The circuit of claim 6, wherein a first select line and a second select line are coupled to the differential inverter circuit, a first input of a differential input is coupled to the first differential current switch and a second input of the differential input is coupled to the second differential current switch wherein selection of the first select line and non-selection of the second select line switches the first input through the first differential current switch and the second input through the second differential current switch out a first differential output channel and selection of the second select line and non-selection of the first select line switches the first input through the first differential current switch and the second input through the second differential current switch out a second differential output channel.

9. The circuit of claim 8, wherein the current switching multiplexer further comprises a third and fourth differential current switch coupled to a midcurrent selection switch wherein a current signal placed on the midcurrent selection switch is switched to the non-selected channel.

10. The circuit of claim 1, wherein the digital-to-analog converter receives frames of data for the more than one channel at a data rate that has a frequency that is a multiple of the number of channels through which the data is being transmitted.

11. An ADSL communication circuit for transmitting data across multiple channels, comprising:
    a current switching digital-to-analog converter operable to receive frames of digital data to be transmitted across a first and a second channel, the current switching digital-to-analog converter adapted to generate sequences of differential analog current signals corresponding to the frames of digital data; and
    a current switching multiplexer coupled to the current switching digital-to-analog converter, wherein the current switching multiplexer is operable to switch the sequences of differential analog current signals between a first and a second output based on a selection and a non-selection of a first and a second select control line.

12. The circuit of claim 11, further comprising a first voltage-to-current converter coupled to the first output of the current switching multiplexer and a second voltage-to-current converter coupled to the second output of the current switching multiplexer, the first voltage-to-current converter adapted to convert sequences of analog current signals to sequences of analog voltage signals for transmission over the first channel and the second voltage-to-current converter adapted to convert sequences of analog current signals to sequences of analog voltage signals for transmission over the second channel.

13. The circuit of claim 11, the current switching multiplexer being further adapted to provide a setting of a midcurrent signal for the channel that has not been selected for data transmission.

14. The circuit of claim 11, the ADSL communication circuit being incorporated with a coder/decoder device of a data transmission terminal.

15. The circuit of claim 11, the current switching multiplexer comprising a first differential current switch and a second differential current switch operable to allow a differential current to flow to one of a first channel and a second channel, the first and second differential current switches being embedded in a differential inverter circuit, the differential inverter circuit allowing for selectability between switching current between the first and second channel.

16. The circuit of claim 15, wherein differential inverter circuit comprises a plurality of p-transistors and n-transistors that are sized to have generally matching transconductances, thereby providing smooth switching transitions during selectability between the first channel and the second channel.

17. The circuit of claim 15, wherein a first select line and a second select line are coupled to the differential inverter circuit, a first input of a differential input is coupled to the first differential current switch and a second input of the differential input is coupled to the second differential input wherein selection of the first select line and non-selection of the second select line switches the first input through the first differential current switch and the second input through the second differential current switch out a first differential output channel and selection of the second select line and non-selection of the first select line switches the first input through the first differential current switch and the second input through the second differential current switch out a second differential output channel.

18. The circuit of claim 17, wherein the current switching multiplexer further comprises a third and fourth differential current switch coupled to a midcurrent selection switch wherein the current signal placed on the midcurrent selection switch is switched to the non-selected channel.

19. The circuit of claim 11, wherein a digital-to-analog converter receives frames of data at twice the data rate of a single channel device.

20. A method for transmitting data over multiple communication lines, comprising the steps of:

providing frames of digital data assigned to more than one channel to a current switching digital-to-analog converter;

converting the frames of digital data to sequences of analog current data by the current switching digital-to-analog converter;

switching the sequences of analog current data to the more than one channel based on a channel that the data is assigned; and converting the analog current data to analog voltage data prior to transmission over a communication line.

21. The method of claim 20, further comprising providing a midcurrent analog signal to a channel of the more than one channel not transmitting data over a communication line.

22. An ADSL communication circuit for transmitting data across multiple channels, comprising:

means for converting frames of digital data to be transmitted over at least two channels to sequences of analog current data;

means for switching the sequences of analog current data between the at least two channels;

means for selecting the channel of the at least two channels for transmitting the sequences of analog current data; and means for converting the analog current data to analog voltage data prior to transmission of the data over a communication line.

23. The circuit of claim 22, further comprising means for selecting a current signal level for at least one channel not transmitting data.

24. A multiple channel data transmission circuit, comprising:

a current switching digital-to-analog converter operable to receive digital data and generate one or more current signals corresponding to the digital data; and a current switching multiplexer coupled to the current switching digital-to-analog converter, wherein the current switching multiplexer is operable to switch the one or more analog current signals between at least two channels.

25. The circuit of claim 24, wherein a first current-to-voltage component is coupled to a first output of the current switching multiplexer and a second current-to-voltage component is coupled to a second output of the current switching multiplexer.

26. The circuit of claim 24, wherein the current switching multiplexer provides for selectability of the current level of the non-selected channel.

27. The circuit of claim 24, the current switching multiplexer comprising a first current switch and a second current switch embedded in an inverter circuit.

28. The circuit of claim 27, wherein the inverter circuit comprises a plurality of p-transistors and n-transistors that are sized to have generally matching transconductances.

29. The circuit of claim 28, wherein a first select line and a second select line are coupled to the inverter circuit, a first input of an input is coupled to the first current switch and a second input of the input is coupled to the second current switch, wherein selection of the first select line and non-selection of the second select line switches the first input through the first current switch and the second input through the second current switch out a first output channel and selection of the second select line and non-selection of the first select line switches the first input through the first current switch and the second input through the second current switch out a second output channel.

30. The circuit of claim 29, wherein the current switching multiplexer further comprises a third and fourth current switch coupled to a midcurrent selection switch wherein a current signal placed on the midcurrent selection switch is switched to the non-selected channel.

* * * * *